(12) United States Patent
Jacobsson et al.

(10) Patent No.: US 9,661,738 B1
(45) Date of Patent: May 23, 2017

(54) EMBEDDED COINS FOR HDI OR SEQ LAMINATIONS

(71) Applicant: Flextronics AP, LLC, Broomfield, CO (US)

(72) Inventors: Henrik Jacobsson, Kullavik (SE); Pui Yin Yu, Tsuen Wan (HK)

(73) Assignee: Flextronics AP, LLC, Broomfield, CO (US)

(*) Notice: Subject to any disclaimer, the term of this patent is extended or adjusted under 35 U.S.C. 154(b) by 0 days.

(21) Appl. No.: 14/476,549

(22) Filed: Sep. 3, 2014

(51) Int. Cl.
 *H05K 1/00* (2006.01)
 *H05K 1/02* (2006.01)
 *H05K 3/44* (2006.01)

(52) U.S. Cl.
 CPC ......... *H05K 1/0206* (2013.01); *H05K 1/0207* (2013.01); *H05K 3/445* (2013.01)

(58) Field of Classification Search
 CPC .... H05K 1/0206; H05K 1/0207; H05K 3/445; H05K 1/00
 USPC ................ 174/252, 250, 251, 255–258, 260
 See application file for complete search history.

(56) References Cited

U.S. PATENT DOCUMENTS

| | | | |
|---|---|---|---|
| 4,069,497 A | 1/1978 | Steidlitz | |
| 4,338,149 A | 7/1982 | Quaschner | |
| 4,712,160 A | 12/1987 | Sato et al. | |
| 4,899,256 A | 2/1990 | Sway-Tin | |
| 5,101,322 A | 3/1992 | Ghaem et al. | |
| 5,116,440 A | 5/1992 | Takeguchi | |
| 5,121,297 A | 6/1992 | Haas | |
| 5,175,047 A | 12/1992 | McKenney | |
| 5,206,463 A | 4/1993 | DeMaso | |
| 5,235,491 A | 8/1993 | Weiss | |
| 5,272,599 A | 12/1993 | Koenen | |
| 5,295,044 A | 3/1994 | Araki et al. | |
| 5,365,403 A | 11/1994 | Vinciarelli et al. | |
| 5,536,677 A | 7/1996 | Hutbacher | |
| 5,838,554 A | 11/1998 | Lanni | |
| 5,872,051 A | 2/1999 | Fallon et al. | |
| 5,873,512 A | 2/1999 | Bielick et al. | |
| 5,920,458 A | 7/1999 | Azar | |
| 5,933,324 A | 8/1999 | Barrett | |
| 6,189,771 B1 | 2/2001 | Maeda et al. | |
| 6,243,269 B1 | 6/2001 | Dibene, II et al. | |
| 6,245,595 B1 | 6/2001 | Nguyen | |
| 6,272,015 B1 | 8/2001 | Mangtani | |
| 6,282,092 B1 | 8/2001 | Okamoto et al. | |
| 6,311,139 B1 | 10/2001 | Kuroda et al. | |
| 6,369,328 B1 | 4/2002 | Munakata | |
| 6,408,429 B1 | 6/2002 | Marrion, Jr. | |
| 6,549,409 B1 | 4/2003 | Saxelby et al. | |
| 6,775,162 B2 | 8/2004 | Mihai et al. | |
| 6,795,315 B1 | 9/2004 | Wu et al. | |
| 7,208,833 B2 | 4/2007 | Nobori et al. | |
| 7,676,775 B2 | 3/2010 | Chen et al. | |
| 8,101,244 B2 | 1/2012 | Clarke | |
| 8,330,051 B2 * | 12/2012 | Huang ................. | H05K 1/0204 174/252 |
| 8,707,221 B2 | 4/2014 | Durkan | |

(Continued)

*Primary Examiner* — Tremesha S Willis
(74) *Attorney, Agent, or Firm* — Haverstock & Owens LLP

(57) ABSTRACT

A method of and a device for dissipating/transferring heat through one or more solid vias and embedded coins are disclosed. The method and device disclosed herein can be used to transfer heat for a High Density Interconnect (HDI) board.

15 Claims, 3 Drawing Sheets

(56) References Cited

U.S. PATENT DOCUMENTS

| | | | |
|---|---|---|---|
| 2001/0003427 A1 | 6/2001 | Ferguson et al. | |
| 2001/0018263 A1 | 8/2001 | Ochiai et al. | |
| 2001/0045297 A1 | 11/2001 | Miller et al. | |
| 2001/0055069 A1 | 12/2001 | Hudson | |
| 2002/0008963 A1 | 1/2002 | DiBene, II et al. | |
| 2002/0092160 A1 | 7/2002 | McCullough | |
| 2004/0122606 A1 | 6/2004 | Cohen et al. | |
| 2004/0144527 A1 | 7/2004 | Yang et al. | |
| 2005/0246590 A1 | 11/2005 | Lancaster | |
| 2006/0196642 A1 | 9/2006 | Gharib | |
| 2006/0265865 A1 | 11/2006 | Yoshida | |
| 2007/0198548 A1 | 8/2007 | Lee | |
| 2007/0272435 A1* | 11/2007 | Johnson | H05K 1/0204 174/259 |
| 2007/0273011 A1 | 11/2007 | Singleton et al. | |
| 2008/0217768 A1 | 9/2008 | Miranda et al. | |
| 2008/0224026 A1 | 11/2008 | Pasternak | |
| 2008/0301597 A1 | 12/2008 | Chen et al. | |
| 2009/0014501 A1 | 1/2009 | Nishi et al. | |
| 2009/0265155 A1 | 10/2009 | Yokogawa | |
| 2011/0203839 A1* | 8/2011 | Iwamoto | H05K 3/4608 174/260 |
| 2011/0307752 A1 | 12/2011 | Fujil et al. | |
| 2012/0024575 A1* | 2/2012 | Zhang | H01L 23/3677 174/252 |
| 2012/0063096 A1* | 3/2012 | Kearney | H01L 23/3107 361/718 |
| 2014/0105717 A1 | 4/2014 | Looi | |
| 2015/0376444 A1 | 12/2015 | Saito | |

* cited by examiner

EMBEDDED COINS FOR HDI OR SEQ LAMINATIONS

FIELD OF THE INVENTION

The present invention relates to the field of electronic manufacturing. More specifically, the present invention relates to heat dissipation of electronic devices.

BACKGROUND OF THE INVENTION

The trend of having high circuit density leads to problems of thermal dissipation in the PCB (printed circuit board) assembly process. Improved efficiency of thermal dissipation is helpful to make the devices work properly, especially for high power system and its IC packaging.

In some cases, a metal coin is embedded inside the PCB under the high power component or the IC chip, such that heat can be dissipated to the other side of the PCB and can be carried away by another heat sink device or a cabinet physically contacted to the coin.

SUMMARY OF THE INVENTION

A method of and a device for dissipating/transferring heat through one or more solid vias and embedded coins are disclosed. The method and device disclosed herein can be used to improve heat transfer for High Density Interconnect (HDI) board. In some embodiments, a high heat transfer efficiency material, such as a metal coin, is embedded in sub-layers and one or more micro-vias are drilled in outer layers. The micro-via is landed on the metal coin. The micro-vias, formed by a solid via plating, can transfer heat efficiently from the top side of the PCB to the bottom side of the PCB via the embedded coin.

In an aspect, a heat dissipating device comprises a coin embedded in a PCB board and one or more vias thermally coupling with the coin. In some embodiments, the coin comprises a metal coin. In other embodiments, the one or more vias are thermally coupled with a heat source. In some other embodiments, the one or more vias are thermally coupled with a heat sink. In some embodiments, the PCB board is sandwiched by a heat source and a heat sink. In other embodiments, the PCB board is thicker than the thickness of the coin.

In another aspect, a method of making a heat dissipating device comprises embedding a coin in an electronic board and forming one or more heat conducting channels, such that the one or more heat conducting channels thermally couple a heat source and the coin. In some embodiments, the one or more heat conducting channels comprise one or more vias. In other embodiments, the method further comprises core routing. In some other embodiments, the core routing forms a recess having a size larger than the size of the coin. In some embodiments, the method further comprises inserting the coin. In other embodiments, the method further comprises drilling one or more holes on the electronic board in an area with the coin. In some other embodiments, the method further comprises plating the one or more holes to form the one or more heat conducting channels. In some embodiments, the drilling is performed by using a $CO_2$ laser. In some other embodiments, the method further comprises reflowing.

In another aspect, an electronic device comprises a metal piece embedded inside an electronic board, a first set of multiple heat conducting paths thermally coupled with the metal piece on the first side, and a second set of multiple heat conducting paths thermally coupled with the metal piece on the opposite side. In some embodiments, the first set of multiple heat conducting paths are thermally coupled with a heat source. In other embodiments, the heat source comprises an electronic component. In some other embodiments, the electronic component comprises an IC chip. In some embodiments, the second set of multiple heat conducting paths thermally couple with one or more heat sinks.

Other features and advantages of the present invention will become apparent after reviewing the detailed description of the embodiments set forth below.

BRIEF DESCRIPTION OF THE DRAWINGS

Embodiments will now be described by way of examples, with reference to the accompanying drawings which are meant to be exemplary and not limiting. For all figures mentioned herein, like numbered elements refer to like elements throughout.

DETAILED DESCRIPTION OF THE PREFERRED EMBODIMENT

Reference is made in detail to the embodiments of the present invention, examples of which are illustrated in the accompanying drawings. While the invention is described in conjunction with the embodiments below, it is understood that they are not intended to limit the invention to these embodiments and examples. On the contrary, the invention is intended to cover alternatives, modifications and equivalents, which can be included within the spirit and scope of the invention as defined by the appended claims. Furthermore, in the following detailed description of the present invention, numerous specific details are set forth in order to more fully illustrate the present invention. However, it is apparent to one of ordinary skill in the prior art having the benefit of this disclosure that the present invention can be practiced without these specific details. In other instances, well-known methods and procedures, components and processes have not been described in detail so as not to unnecessarily obscure aspects of the present invention. It is, of course, appreciated that in the development of any such actual implementation, numerous implementation-specific decisions must be made in order to achieve the developer's specific goals, such as compliance with application and business related constraints, and that these specific goals are vary from one implementation to another and from one developer to another. Moreover, it is appreciated that such a development effort can be complex and time-consuming, but is nevertheless a routine undertaking of engineering for those of ordinary skill in the art having the benefit of this disclosure.

Figure 1A:
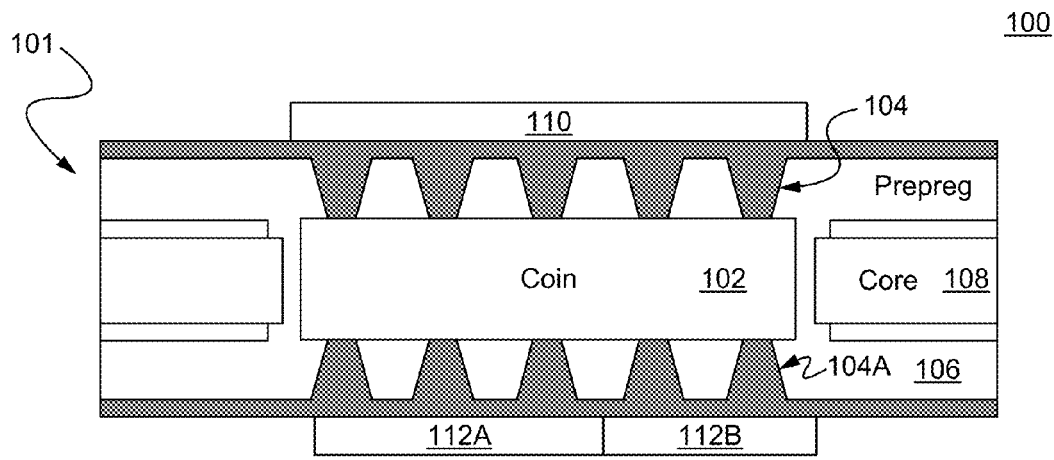
FIG. 1A illustrates a heat dissipating device in accordance with some embodiments of the present invention.

FIG. 1A illustrates a heat dissipating device 100 in accordance with some embodiments of the present invention. The device 100 comprises a PCB 101 having an embedded coin 102. The embedded coin 102 is structured to thermally couple with one or more of the micro-vias 104, such that the micro-vias can conduct heat. The PCB 101 contains a pre-preg composite material 106 surrounding a core 108 and the coin 102. Pre-preg can be a pre-impregnated composite fibers where a matrix material, such as epoxy, is already present. The fibers can take the form of a weave and the matrix is used to bond them together with other components during manufacture. The matrix is preferably only partially cured to allow easy handling.

In some embodiments, the coin 102 is square. In other embodiments, the coin 102 is a circle shape or rounded. The shape of the coin 102 is able to be any predetermined shape to facilitate the heat dissipation or conduction. In some embodiments, the coin has a surface area 2 mm×3 mm and a thickness 0.88 mm. The sizes (e.g., surface area and the thickness) of the coin 102 can be thicker/thinner or larger/smaller, such as 5 mm×5 mm and 1.3 mm.

In some embodiments, a computing device 110 generates an amount of heat. The heat can be conducted and transported by the first set of the micro-vias 104. The first set of micro-vias 104 can transfer the heat from the coupling device 110 to the coin 102. A second set of the micro-vias 104A can remove/conduct the heat away from the coin 102. A heat sink 112A or a heat conducting device 112B can dissipate/conduct the heat away from the second set of the micro-vias 104A. A person of ordinary skill in the art will appreciate that the micro-vias can be constructed in various predetermined shapes, such as triangle, rounded circle, and rectangular.

Figure 1B:
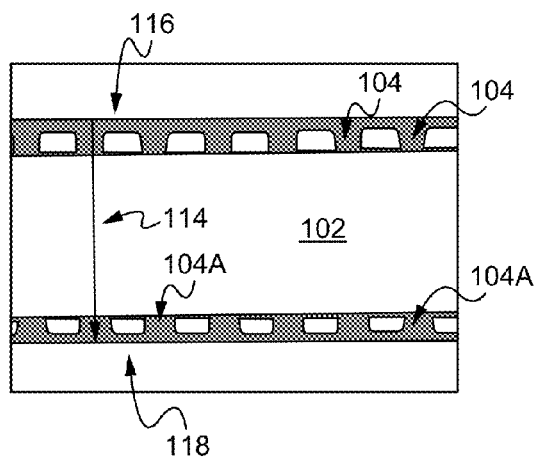
FIG. 1B illustrates a blow up view of a section of the heat dissipating device of FIG. 1A in accordance with some embodiments of the present invention.

FIG. 1B illustrates a blow up view of a section of the heat dissipating device 100 of FIG. 1A in accordance with some embodiments. Heat at a side of the heat source 116 is able to be transferred through the continuous heat conducting path 114. Heat from the side of the heat source 116 is transferred to the first set of the micro-vias 104. The first set of the micro-vias 104 is in a thermal and physical contact with the coin 102. The coin 102 is in a thermal and physical contact with the second set of the micro-vias 104A. The second surface 118 is in a thermal and physical contact with the second set of the micro-via 104A. With the continuous heat conducting path 114, heat is able to be conducted from the heat source side 116 to the second surface 118. The micro-vias 104 and 104A are shown as examples. Multiple layers of the micro-vias are able to be included.

Figure 1C:
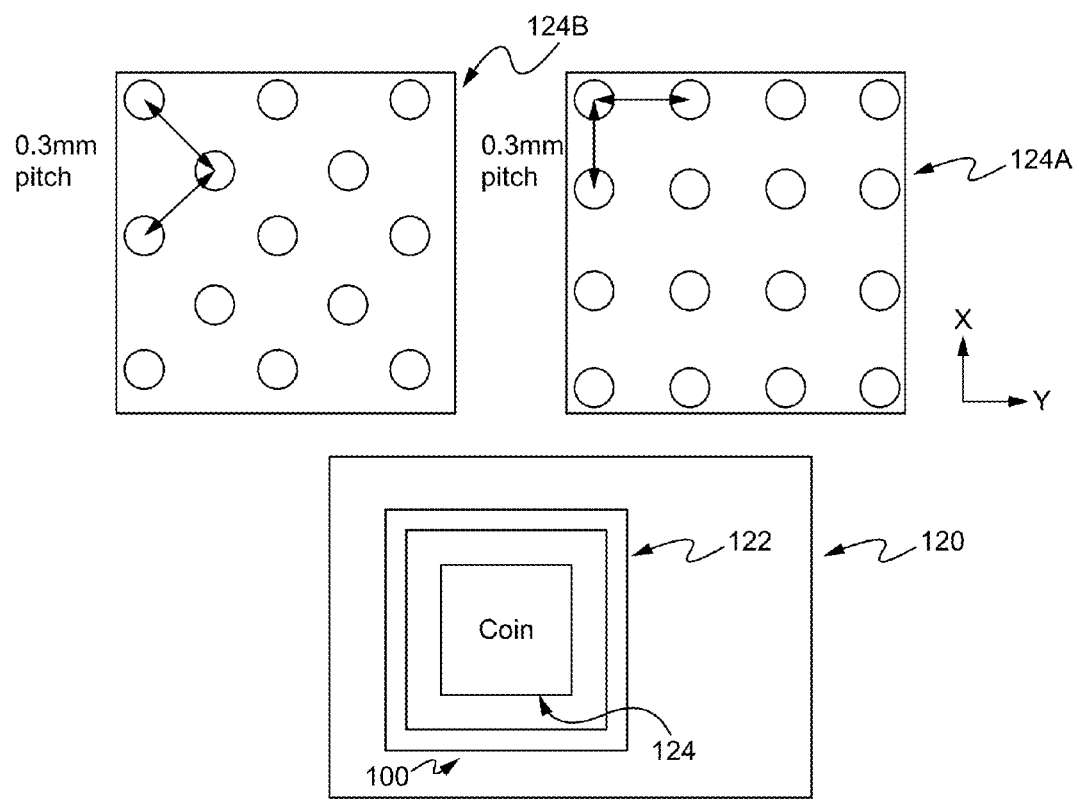
FIG. 1C illustrates a top view of a PCB board with the heat dissipating device in accordance with some embodiments of the present invention.

FIG. 1C illustrates a top view of a PCB board 120 with the heat dissipating device 100 in accordance with some embodiments of the present invention. The heat dissipating device 100 can be used on a spot coupled with a heat source (e.g., a CPU) on a PCB 120. During a manufacturing process, a recess 122 that is larger than a size of a coin 124 is formed, such that the coin 124 is able to be embedded inside the recess. In some embodiments, once the coin 124 is embedded (such as the vertical location of the coin 102 of FIG. 1A), the board surface is flatted after lamination, such that no protrusion or depression at the coin embedded area. Micro-vias, such as in the patterns of 124A and 124B, are located at the area of the coin 124 (top view) and like the micro-vias 104 and 104A in FIG. 1A. The micro-vias 124A and 124B are able to be constructed in various patterns. For example, the distance between the two neighboring micro-vias can be 0.3 mm in their x-axis or y-axis (pattern 124A) or in their diagonal distances (pattern 124B). A person of ordinary skill in the art can appreciate that the micro-vias can be constructed/located in various locations, clustered evenly or unevenly in the area of coin 124, and/or structured in various sizes and shapes (such as circular pillars or hexagonal prism).

Figure 2:
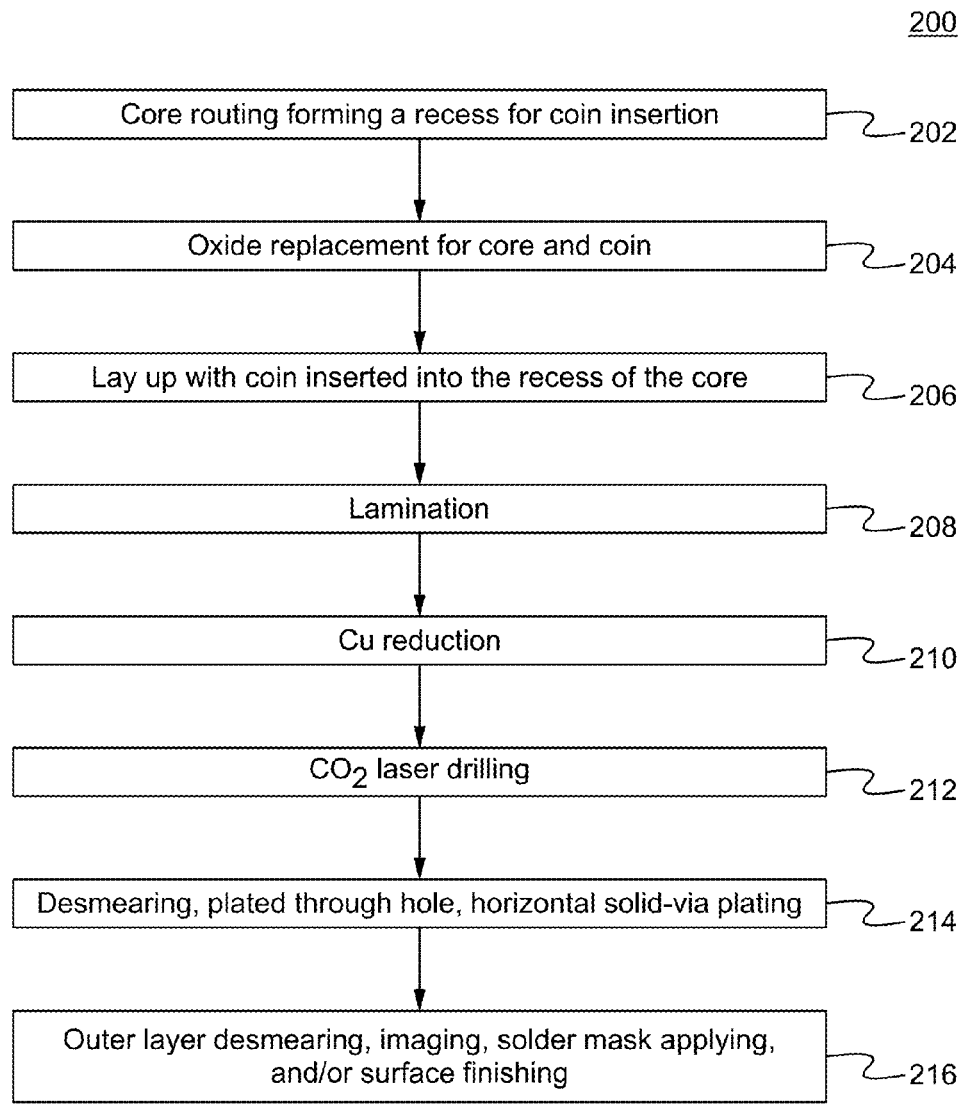
FIG. 2 is a flow chart illustrates a method of making a coin embedded heat dissipating device in accordance with some embodiments of the present invention.

FIG. 2 is a flow chart illustrates a method 200 of making a coin embedded heat dissipating device in accordance with some embodiments of the present invention. The method 200 can begin from Step 202. At Step 202, core routing is performed to make an aperture/hole/recess for coin insertion. In some embodiments, the size of the core routing is larger than the size of the coin, such that the coin is able to be placed/inserted inside the aperture or recess. At Step 204, oxide replacement for core and coin is performed. At Step 206, the coin is inserted into the recess. At Step 208, lamination is performed. At Step 210, copper reduction is performed in some embodiments. At Step 212, drilling is performed to make holes that are used to form micro-vias. In some embodiments, the drilling is performed using a $CO_2$ laser. In some other embodiments, the drilling is performed using a mechanical drilling tool. At Step 214, desmearing process, plated through hole (PTH) process, and plating are performed. At Step 216, one or more of outer layer desmearing, imaging, solder mask applying, and surface finishing processes is/are performed.

The heat dissipating device can be utilized in high density interconnect boards with lamination. In operation, heat at a heat source can be carried away/conducted from one side of a PCB board to the other side through a continuous and uninterrupted heat conducting path, such as from a first solid micro-via on the first surface of the PCB through a coin to a second solid micro-via on the second surface of the PCB.

The present invention has been described in terms of specific embodiments incorporating details to facilitate the understanding of principles of construction and operation of the invention. Such reference herein to specific embodiments and details thereof is not intended to limit the scope of the claims appended hereto. It is readily apparent to one skilled in the art that other various modifications can be made in the embodiment chosen for illustration without departing from the spirit and scope of the invention as defined by the claims.

What is claimed is:

1. A heat dissipating device comprising:
   a. a coin embedded in a PCB board such that all surfaces of the coin are covered; and
   b. a plurality of vias thermally coupling with and directly connected to the coin, wherein the PCB board is sandwiched by a heat source and a heat sink such that a first subset of vias is thermally coupled to the heat source and directly connected to a first side of the coin, and a second subset of vias is thermally coupled to the heat sink and directly connected to a second side of the coin opposite the first side, further wherein the coin is completely encapsulated by prepreg of the PCB board on all sides except where the first subset of vias contact the first side and where the second subset of vias contact the second side.

2. The device of claim 1, wherein the coin comprises a metal coin.

3. The device of claim 1, wherein the PCB board is thicker than the thickness of the coin.

4. A method of making a heat dissipating device comprising:
   a. embedding a coin in an electronic board by forming a recess in the electronics board, placing the coin in the recess and performing lamination; and
   b. forming a plurality of heat conducting channels, such that a first subset of heat conducting channels are thermally coupling and directly connecting a heat source and the coin, and a second subset of heat conducting channels are thermally coupling and directly connecting a heat sink and the coin, further wherein the coin is completely encapsulated by prepreg of the electronic board on all sides except where the first subset of heat conducting channels contact a first side and where the second subset of heat conducting channels contact a second side, wherein the one or more heat conducting channels comprises one or more vias.

5. The method of claim 4, further comprising core routing.

6. The method of claim 5, wherein the core routing forms a recess having a size larger than a size of the coin.

7. The method of claim 4, further comprising inserting the coin.

8. The method of claim 4, further comprising drilling one or more holes on the electronic board in an area with the coin.

9. The method of claim 8, further comprising plating the one or more holes to form the one or more heat conducting channels.

10. The method of claim 8, wherein the drilling is performed by using a $CO_2$ laser.

11. An electronic device comprising:
 a. a metal piece embedded inside an electronic board such that all surfaces of the metal piece are covered;
 b. a first set of multiple heat conducting paths thermally coupled with and directly connected to the metal piece on a first side; and
 c. a second set of multiple heat conducting paths thermally coupled with and directly connected to the metal piece on an opposite side,
wherein the metal piece is completely encapsulated by prepreg of the electronic board on all sides except where the first subset of multiple heat conducting paths contact the first side and where the second subset of multiple heat conducting paths contact the opposite side.

12. The device of claim 11, wherein the first set of multiple heat conducting paths are thermally coupled with a heat source.

13. The device of claim 12, wherein the heat source comprises an electronic component.

14. The device of claim 13, wherein the electronic component comprises an IC chip.

15. The device of claim 11, wherein the second set of multiple heat conducting paths thermally couple with one or more heat sinks.

* * * * *